(12) United States Patent
Pedersen et al.

(10) Patent No.: US 8,638,122 B2
(45) Date of Patent: *Jan. 28, 2014

(54) APPARATUS FOR METASTABILITY-HARDENED STORAGE CIRCUITS AND ASSOCIATED METHODS

(75) Inventors: Bruce B. Pedersen, Sunnyvale, CA (US); Sivaraman Chokkalingam, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/089,221

(22) Filed: Apr. 18, 2011

(65) Prior Publication Data
US 2011/0193593 A1    Aug. 11, 2011

Related U.S. Application Data

(63) Continuation of application No. 12/568,567, filed on Sep. 28, 2009, now Pat. No. 7,928,768.

(51) Int. Cl.
*H03K 19/00* (2006.01)

(52) U.S. Cl.
USPC ..................... 326/94; 326/9; 326/10

(58) Field of Classification Search
None
See application file for complete search history.

(56) References Cited

U.S. PATENT DOCUMENTS

| | | | |
|---|---|---|---|
| 6,327,176 B1 * | 12/2001 | Li et al. | 365/156 |
| 6,492,857 B2 * | 12/2002 | Shuler, Jr. | 327/225 |
| 7,027,542 B1 | 4/2006 | Shihadeh | |
| 7,095,259 B2 | 8/2006 | Knotts | |
| 7,288,969 B1 | 10/2007 | Sleigh et al. | |
| 7,623,051 B2 | 11/2009 | Murden et al. | |
| 7,653,795 B2 | 1/2010 | Bull | |
| 7,928,768 B1 * | 4/2011 | Pedersen et al. | 326/94 |
| 2011/0215852 A1 | 9/2011 | Klein et al. | |
| 2011/0227625 A1 | 9/2011 | Lewis et al. | |

\* cited by examiner

*Primary Examiner* — Anh Tran
(74) *Attorney, Agent, or Firm* — Law Offices of Maximilian R. Peterson

(57) ABSTRACT

A metastability-hardened storage circuit includes at least one inverting circuit. The inverting circuit has a logical input. The logical input of the inverting circuit is split into a pair of physical inputs.

20 Claims, 12 Drawing Sheets

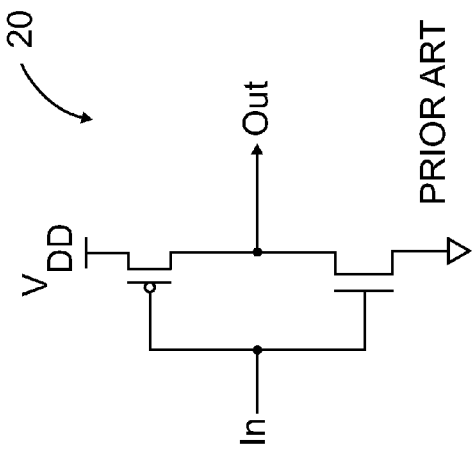
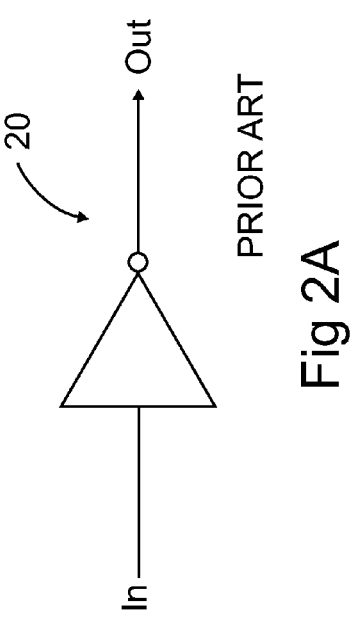
Fig 2A PRIOR ART
Fig 2B PRIOR ART
Fig 3A
Fig 3B

APPARATUS FOR METASTABILITY-HARDENED STORAGE CIRCUITS AND ASSOCIATED METHODS

CROSS-REFERENCE TO RELATED APPLICATIONS

This application is a continuation of, and incorporates by reference, U.S. patent application Ser. No. 12/568,567, filed on Sep. 28, 2009, now U.S. Pat. No. 7,928,768 titled 'Apparatus for Metastability-Hardened Storage Circuits and Associated Methods,' U.S. Pat. No. 7,928,768.

TECHNICAL FIELD

The disclosed concepts relate generally to storage circuits and, more particularly, to apparatus for metastability-hardened storage circuits, and associated methods.

BACKGROUND

Advances in microelectronics have enabled the continued increase in transistor densities of integrated circuits (ICs). Advanced ICs can include hundreds of millions of transistors. The relatively large number of transistors enables circuit designers to integrate a relatively large number of functions.

The design of the chips entails competing factor or considerations, such as speed, power dissipation, and cost. Advances in fabrication techniques, such as complementary metal oxide semiconductor (CMOS), have resulted in the scaling of various parameters, such as power supply voltage, threshold voltages, and current-drive capabilities.

SUMMARY

The disclosed concepts relate generally to storage circuits, such as latches and flip-flops and, more specifically, to apparatus and methods for metastability-hardened storage circuits. In one exemplary embodiment, a metastability-hardened storage circuit includes an inverting circuit (or alternatively, a non-inverting circuit). The inverting circuit (or non-inverting circuit) has a logical input that is split into a pair of physical inputs.

In another exemplary embodiment, a metastability-hardened storage circuit includes an inverting circuit (or alternatively, a non-inverting circuit). The inverting circuit (or non-inverting circuit) has a logical output that is split into a pair of physical outputs.

In yet another exemplary embodiment, an integrated circuit (IC) includes a circuit that has a logical input and a logical output. The logical output is split into a high-bias physical output and a low-bias physical output. During a transition or a metastable state of the circuit, the output voltage of the high-bias physical output is higher than the output voltage of the low-bias physical output.

In yet another exemplary embodiment, a method of metastability-hardening a storage circuit in an electronic circuit includes splitting a logical input of an inverting circuit (or alternatively, a non-inverting circuit). More specifically, the logical input is split into a pair of physical inputs.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

FIGS. 2A and 2B depict, respectively, a conventional inverter, and its CMOS implementation.

FIGS. 3-6 show inverters with split inputs and/or outputs according to exemplary embodiments.

DETAILED DESCRIPTION

The disclosed concepts relate generally to storage circuits, such as latches and flip-flops. More specifically, the disclosed concepts provide apparatus and methods for metastability-hardened storage circuits, e.g., latches and flip-flops.

Conceptually, in exemplary embodiments, the disclosed storage circuits use circuitry that has an additional input and/or circuitry that has an additional output in order to accomplish metastability-hardness. The circuitry with the additional input may constitute an inverting circuit. Similarly, the circuitry with the additional input may constitute an inverting circuit (or element or cell).

In exemplary embodiments, metastability-hardened storage circuits include a cascade-coupled pair of inverting circuits. One of the inverting circuits includes an additional input. Another of the inverting circuits includes an additional output. By coupling the outputs (including the additional output) of the second inverting circuit to the inputs (including the additional input) of the first inverting circuit, one may implement a metastability-hardened storage circuit.

One may provide an additional input by splitting a logical input of circuitry within the storage circuit into a pair of physical inputs. One of the inputs, an n-type metal oxide semiconductor (NMOS) input feeds primarily NMOS transistors within the circuitry (for example, the NMOS transistor in an inverter). The other input, a p-type metal oxide semiconductor (PMOS) input feeds primarily PMOS transistors within the circuitry (for example, the PMOS transistor in an inverter).

For example, one might split the input of an inverter or an input of an AND, NAND, or NOR gate into two inputs.

Similarly, by way of illustration, one may split the output of an inverter, an AND gate, a NAND gate, or a NOR gate into two outputs.

Similarly, one may provide the additional output by splitting a logical output of circuitry within the storage circuit into a pair of physical outputs: a low-bias output (relative to other outputs of the circuit) and a high-bias output (relative to other outputs of the circuit). Generally speaking, the output voltage of the high-bias output is higher than the output voltage of the low-bias output when circuitry within the storage circuit is in or near a metastable state.

Figure 1:
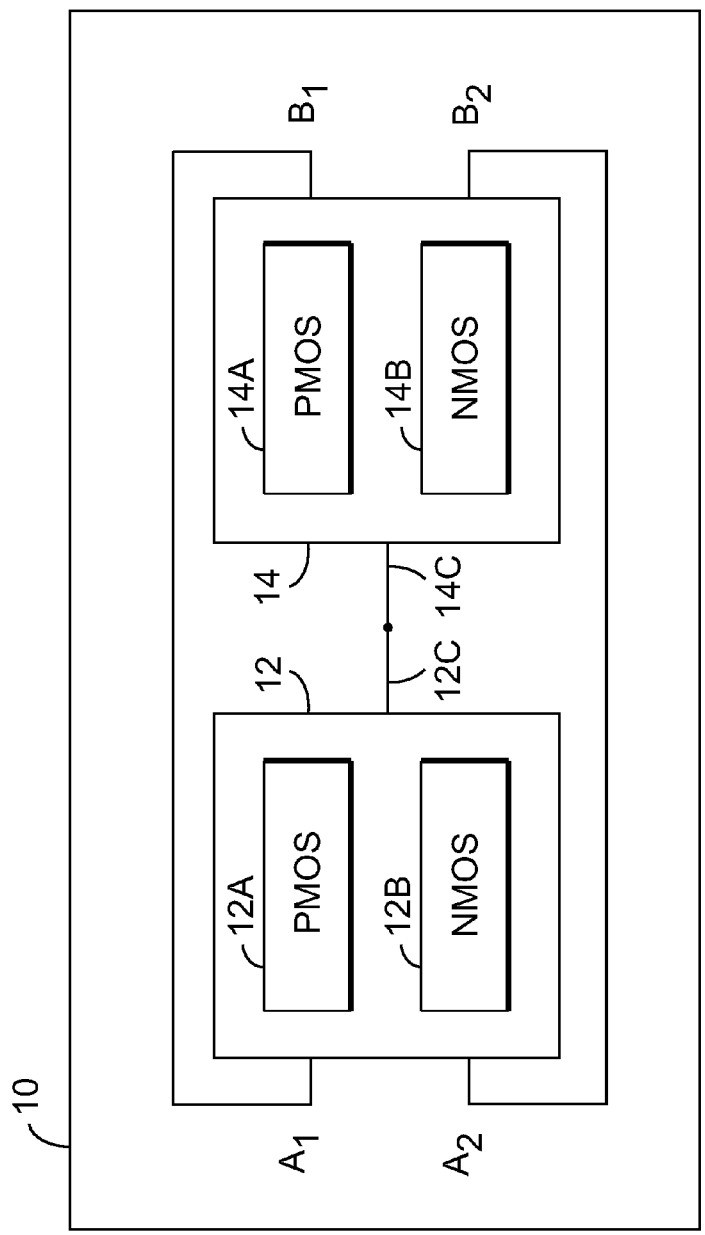
FIG. 1 illustrates a metastability-hardened storage circuit according to an exemplary embodiment.

FIG. 1 illustrates a metastability-hardened storage circuit 10 according to an exemplary embodiment. Storage circuit 10 includes cross-coupled inverting circuits 12 and 14, which form a latch. Examples of inverting circuitry suitable for implementing inverting circuits 12 and 14 include inverters, NAND gates (providing logical inversion with respect to at least one input), NOR gates (providing logical inversion with respect to at least one input), and the like, as persons of ordinary skill in the art who have the benefit of the description of the disclosed concepts understand.

Regardless of its actual implementation, inverting circuit 12 produces at an output the logical complement of a signal applied to an input of inverting circuit 12. Similarly, inverting circuit 14 produces at an output the logical complement of a signal applied to an input of inverting circuit 14.

Note that inverting circuits 12 and 14 may include one or more logic elements or circuits, as desired, and as persons of ordinary skill in the art who have the benefit of the description of the disclosed concepts understand. Inverting circuit 12 and/or inverting circuit 14 may include a single gate (or logic element or circuit). As one example, inverting circuit 12 and/or inverting circuit 14 may include an inverter.

Conversely, in some embodiments, rather than including a single gate, inverting circuit 12 and/or inverting circuit 14 may include a plurality of gates (or logic elements or circuits). Examples include an AND gate coupled to an inverter, an OR gate coupled to an inverter, and the like, as persons of ordinary skill in the art who have the benefit of the description of the disclosed concepts understand.

Inverting circuit 12 includes a set of one or more PMOS transistors 12A, and a set of one or more NMOS transistors 12B. Similarly, inverting circuit 14 includes a set of one or more PMOS transistors 14A, and a set of one or more NMOS transistors 14B.

Inverting circuit 12 has an additional input. More specifically, inverting circuit 12 has logical input A split into physical inputs A1 and A2. Conversely, inverting circuit 14 has an additional output. Thus, inverting circuit 14 has logical output B split into physical outputs B1 and B2.

The split output of inverting circuit 14 couples to the split input of inverting circuit 12. Hence, output B1 of inverting circuit 14 couples to input A1 of inverting circuit 12. Similarly, output B2 of inverting circuit 14 couples to input B2 of inverting circuit 12.

Note that one may split an output of inverting circuit 12, as desired. Furthermore, one may split an input of inverting circuit 14, as desired. Thus, one may couple the split output of inverting circuit 12 to the split input of inverting circuit 14, as desired.

Note that one may provide more than one additional input (split input) for one or both of inverting circuits 12 and 14, as desired. Furthermore, one may provide more than one additional output (split output) for one or both of inverting circuits 12 and 14, as desired.

By splitting one or more inputs and/or one or more outputs, one can improve the drive strength and gain of inverting circuit 12 and/or inverting circuit 14. The improved drive strength helps improve the metastability hardness of inverting circuit 12 and/or inverting circuit 14.

More specifically, one may provide an additional input for inverting circuit 12 and/or inverting circuit 14 by splitting that input into a low-bias input (relative to other inputs of the circuit) and a high-bias input (relative to other inputs of the circuit). Likewise, one may provide an additional output for inverting circuit 12 and/or inverting circuit 14 by splitting that output into a low-bias output (relative to other outputs of the circuit) and a high-bias output (relative to other outputs of the circuit). The output voltage of the high-bias output is higher than the output voltage of the low-bias output when the inverting circuit (e.g., inverting circuit 12 or inverting circuit 14) is in or near a metastable state.

The high-bias outputs couple to the inputs of inverting circuit 12 and/or inverting circuit 14 that drive NMOS transistors 12B and 14B, respectively. The low-bias outputs couple to the inputs of inverting circuit 12 and/or inverting circuit 14 that drive PMOS transistors 12A and 14A, respectively. This configuration increases the gate voltages of the NMOS and PMOS transistors that comprise inverting circuits 12 and 14.

Consequently, the drive strength and the gain of the PMOS and NMOS devices increases, thus reducing the metastability time of storage circuit 10. Put another way, the metastability hardness of storage circuit 10 improves.

As noted, one may split one or more inputs and/or one or more outputs of a variety of inverting circuits. One example constitutes an inverter.

FIGS. 2A and 2B show, respectively, a conventional inverter 20, and its complementary metal oxide semiconductor (CMOS) implementation. The details of the circuitry and the operation of the inverter in FIGS. 2A and 2B fall within the knowledge of persons of ordinary skill in the art. As persons of ordinary skill in the art understand, inverter 20 includes a single physical input, and a single physical output.

In some exemplary embodiments according to the disclosed concepts, to implement metastability-hardened storage circuits, one may split the input and/or output of an inverter. FIGS. 3-6 provide examples according to exemplary embodiments.

FIG. 3A shows an inverter 22 with a split output. More specifically, inverter 22 has a logical output split into two physical outputs, labeled as "Out−" (low-bias) and "Out+" (high-bias).

FIG. 3B shows a CMOS implementation of the inverter shown in FIG. 3A. As persons of ordinary skill in the art who have the benefit of the description of the disclosed concepts understand, one may implement inverter 22 in a variety of ways, and FIG. 3B shows merely an exemplary implementation.

Note that the implementation of inverter 22 includes two inverters, 22A and 22B. Furthermore, the NMOS transistor in inverter 22A has twice (or other desired multiple) the size of the PMOS transistor, whereas the PMOS transistor in inverter 22B has twice (or other desired multiple) the size of the NMOS transistor.

One of the physical inverters, e.g., inverter 22B, drives the high-bias output, and the second physical inverter, e.g., inverter 22A, drives the low-bias output of inverter 22. As noted above, the output voltage of the high-bias output is higher than the output voltage of the low-bias output when inverter 22 is in or near a metastable state.

Put another way, physical inverter 22B, which feeds the high-bias output "Out+" has a PMOS device that is relatively twice as strong (twice the current drive capability) as the corresponding NMOS device. Similarly, physical inverter 22A, feeding the low-bias output "Out−" has an NMOS device that is relatively twice as strong as the corresponding PMOS device.

The two physical inverters (i.e., inverters 22A and 22B) are implemented such that the first physical inverter has a higher switching threshold than the second physical inverter. One may accomplish that goal by adjusting the drive strengths of the PMOS and NMOS devices in the two physical inverters. Specifically, one may design inverter 22 such that the relative strength of the PMOS device versus the NMOS device in the first physical inverter is greater than the relative strength of the PMOS device versus the NMOS device of the second physical inverter.

One may adjust the drive strengths of inverters 22A and 22B in a variety of ways, as persons of ordinary skill in the art who have the benefit of the description of the disclosed concepts understand. For example, one may adjust the length and/or width of the transistors, or by adjusting the threshold voltage(s) of the transistors (such as by changing the dopant implant levels), or by other standard manufacturing techniques (such as changing the gate oxide thickness).

Figure 4B:
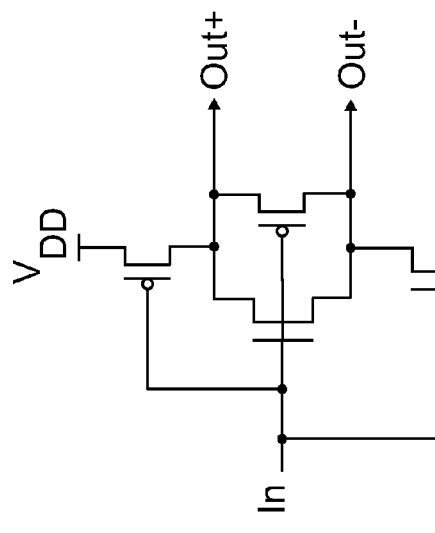
Figure 4A:
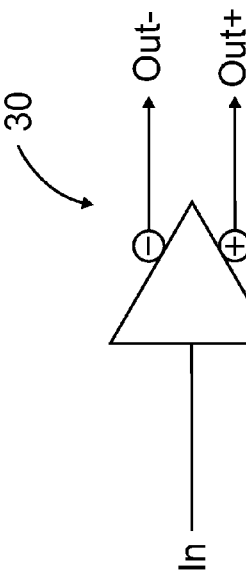

FIGS. 4A-4B illustrate an inverter with a split output according to another exemplary embodiment. FIG. 4A shows an inverter 30 with a split output. Inverter 30 has a logical output split into two physical outputs, labeled as "Out−" (low-bias) and "Out+" (high-bias).

FIG. 4B shows a CMOS implementation of the inverter shown in FIG. 4A. The implementation shown in FIG. 4B addresses the fact that, for CMOS processes that have a relatively high level of on-die process variation, one may not be able to reliably adjust the relative drive strengths of individual NMOS and PMOS devices. By using the configuration shown in FIG. 4B, one avoids the need for matching devices with relatively high accuracy.

As persons of ordinary skill in the art who have the benefit of the description of the disclosed concepts understand, one may implement inverter 30 in a variety of ways. FIG. 4B shows merely an exemplary implementation.

The exemplary implementation of FIG. 4B includes two PMOS devices, and two NMOS devices, coupled as shown in the figure. When inverter 30 is in a metastable condition, all four transistors are on. As a result, the output voltage of the high-bias output to be greater than the voltage of the low-bias output. The mismatch in the output voltages helps decrease the amount of time that inverter 30 spends in the metastable condition.

Figure 5A:
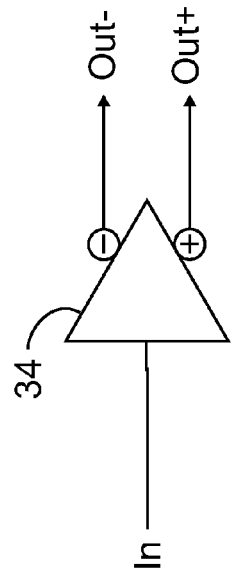
Figure 5B:
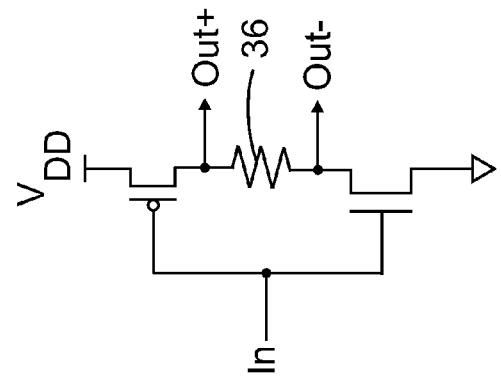

FIGS. 5A-5B illustrate an inverter with a split output according to another exemplary embodiment. FIG. 5A shows an inverter 34 with a split output. Inverter 34 has a logical output split into two physical outputs, labeled as "Out−" (low-bias) and "Out+" (high-bias).

FIG. 5B shows a CMOS implementation of the inverter shown in FIG. 5A. As persons of ordinary skill in the art who have the benefit of the description of the disclosed concepts understand, one may implement inverter 34 in a variety of ways, and FIG. 5B shows merely an exemplary implementation.

The exemplary implementation of inverter 34 (see FIG. 5B) includes resistor (or generally, a resistive circuit or element) 36. Resistor 36 is coupled to the drain of the PMOS device and the drain of the NMOS device in inverter 34. The high-bias output "Out+" is coupled to the drain of the PMOS device and the low-bias output "Out−" is coupled to the drain of the NMOS device.

When inverter 34 is in a metastable condition, both NMOS and PMOS devices are on, and current flows through resistor 36. The flow of current through resistor 36 causes the output voltage of the high-bias output to be greater than the voltage of the low-bias output. The mismatch in the output voltages helps decrease the amount of time that inverter 34 spends in the metastable condition.

As persons of ordinary skill in the art who have the benefit of the description of the disclosed concepts understand, one may implement resistor 36 in a variety of ways, as desired. For example, one may implement resistor 36 as a combination of a resistor, one or more diodes, a second PMOS device with its gate tied to circuit ground (GND), or an NMOS device with its gate tied to the supply voltage ($V_{DD}$).

Figure 6B:
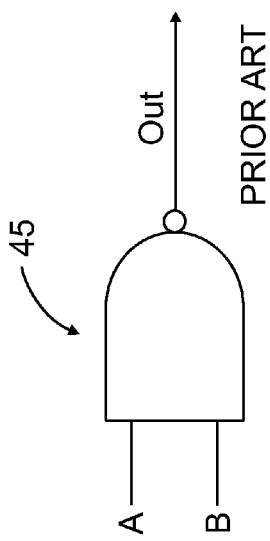
Figure 6A:
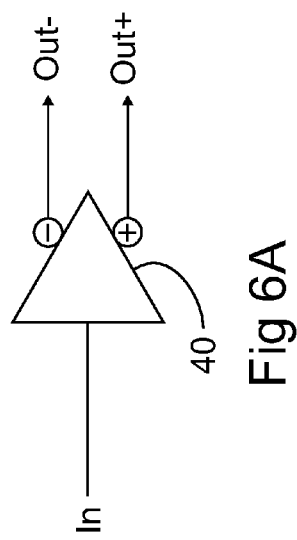

FIGS. 6A-6B illustrate an inverter with a split output according to another exemplary embodiment. FIG. 6A shows an inverter 40 with a split output. Inverter 40 has a logical output split into two physical outputs, labeled as "Out−" (low-bias) and "Out+" (high-bias).

FIG. 6B shows a CMOS implementation of the inverter shown in FIG. 6A. As persons of ordinary skill in the art who have the benefit of the description of the disclosed concepts understand, one may implement inverter 40 in a variety of ways. FIG. 6B shows merely an exemplary implementation.

The exemplary implementation of inverter 40 (see FIG. 6B) includes resistive circuit or element 36. Resistive circuit 36 is coupled to the drain of the PMOS device and the drain of the NMOS device in inverter 40. The high-bias output "Out+" is coupled to the drain of the PMOS device and the low-bias output "Out−" is coupled to the drain of the NMOS device.

Resistive circuit 36 includes a PMOS transistor coupled in parallel with an NMOS transistor. The gate of the NMOS transistor couples to the supply voltage ($V_{DD}$), and the gate of the PMOS couples to circuit ground (GND). As persons of ordinary skill in the art who have the benefit of the description of the disclosed concepts understand, one may implement resistive circuit 36 in a variety of other ways, as desired.

Referring to FIG. 6B, when inverter 40 is in a metastable condition, all transistors in inverter 40 are on, and current flows through resistive circuit 36. Similar to the circuit in FIG. 5B, the flow of current through resistive circuit 36 causes the output voltage of the high-bias output to be greater than the voltage of the low-bias output. The mismatch in the output voltages helps decrease the amount of time that inverter 40 spends in the metastable condition.

Figure 7A:
FIGS. 7A and 7B illustrate, respectively, depict, respectively, a conventional NAND gate, and its CMOS implementation.
Figure 7B:
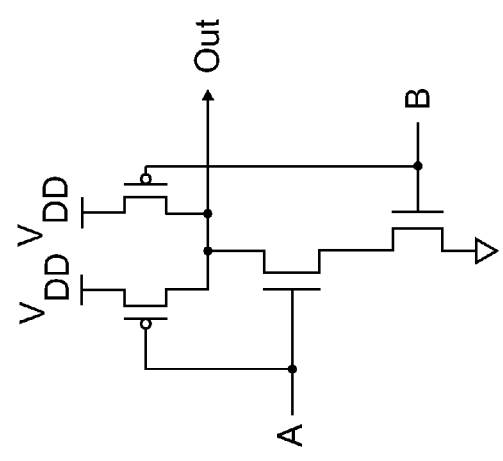

As noted, one may use a NAND gate as an inverting circuit. FIGS. 7A and 7B show, respectively, a conventional NAND gate 45, and its CMOS implementation. The details of the circuitry and the operation of the inverter in FIGS. 7A and 7B fall within the knowledge of persons of ordinary skill in the art. As persons of ordinary skill in the art understand, NAND gate 45 includes two physical inputs, and a single physical output.

In some exemplary embodiments according to the disclosed concepts, to implement metastability-hardened storage circuits, one may split the input and/or output of a NAND gate. FIGS. 8-9 provide examples according to exemplary embodiments.

Figure 8B:
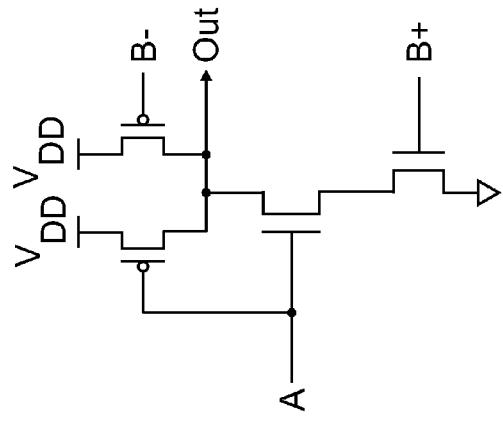
FIGS. 8A and 8B show, respectively, a NAND gate with a split input, and its CMOS implementation, according to an exemplary embodiment.
Figure 8A:
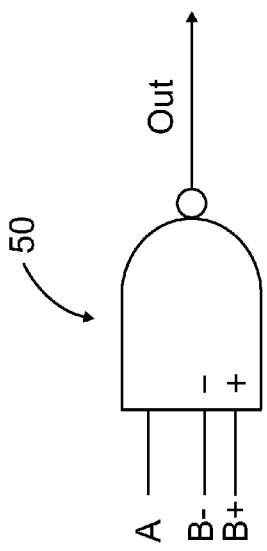

FIG. 8A illustrates a NAND gate 50 with a logical input split into two physical inputs, according to an exemplary embodiment. FIG. 8B shows a CMOS implementation of NAND gate 50, according to an exemplary embodiment. As persons of ordinary skill in the art who have the benefit of the description of the disclosed concepts understand, one may implement NAND gate 50 in a variety of ways, and FIG. 8B shows merely an exemplary implementation.

Referring to FIG. 8A, NAND gate 50 has two logical inputs, A and B. Logical input A corresponds to physical input A. Logical input B, however, is implemented as a split input, i.e., as physical inputs B− and B+.

Referring to FIG. 8B, the physical NMOS input (feeding the NMOS transistors in FIG. 8B) is labeled with a "+," and the physical PMOS input (feeding the PMOS transistors in FIG. 8B) is labeled with a "−." The physical signals labeled "B+" and "B−" correspond to the split logical signal B.

Figure 9A:
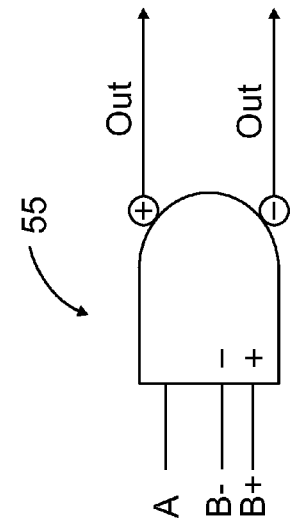
FIGS. 9A and 9B illustrate, respectively, a NAND gate with a split input and a split output, and its CMOS implementation, according to an exemplary embodiment.

FIG. 9A illustrates a NAND gate 55 with a logical input split into two physical inputs, according to an exemplary embodiment. The split inputs of NAND gate 55 are similar to the split inputs of NAND gate 50 (see FIGS. 8A-8B).

Referring to FIG. 9A, NAND gate 55 has two logical inputs, A and B. Logical input A corresponds to physical input A. Logical input B, however, is implemented as a split input, i.e., as physical inputs B− and B+.

Figure 9B:
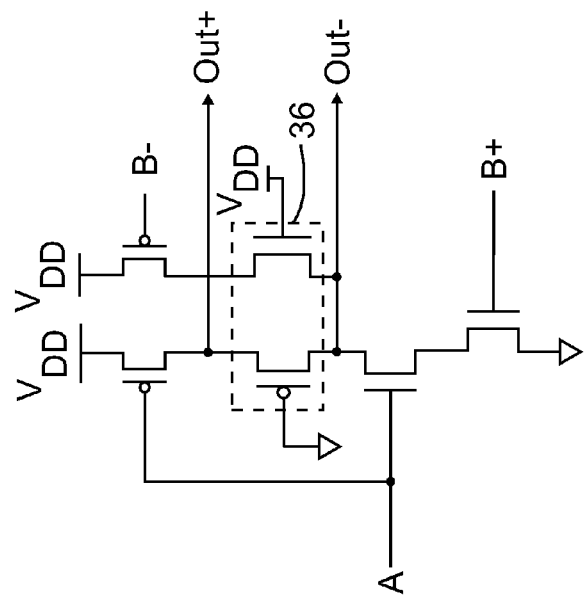

FIG. 9B shows a CMOS implementation of NAND gate 55, according to an exemplary embodiment. As persons of ordinary skill in the art who have the benefit of the description of the disclosed concepts understand, one may implement NAND gate 55 in a variety of ways, and FIG. 9B shows merely an exemplary implementation.

The physical NMOS input (feeding the NMOS transistors in FIG. 9B) is labeled with a "+," and the physical PMOS input (feeding the PMOS transistors in FIG. 9B) is labeled with a "−." The physical signals labeled "B+" and "B−" correspond to the split logical signal B.

NAND gate 55 also has a split output. More specifically, the logical output of NAND gate 55 is split into two physical outputs: low-bias output (Out−), and high-bias output (Out+).

Referring to FIG. 9B, NAND gate 55 includes resistive circuit 36. In the exemplary embodiment shown, resistive circuit 36 includes a PMOS transistor coupled in parallel with an NMOS transistor. The gate of the NMOS transistor couples to the supply voltage ($V_{DD}$), and the gate of the PMOS couples to circuit ground (GND). As persons of ordinary skill in the art who have the benefit of the description of the disclosed concepts understand, one may implement resistive circuit 36 in a variety of other ways, as desired.

Referring to FIG. 9B, when NAND gate 55 is in a metastable condition, all transistors in NAND gate 55 are on, and current flows through resistive circuit 36. The flow of current through resistive circuit 36 causes the output voltage of the high-bias output to be greater than the voltage of the low-bias output. The mismatch in the output voltages helps decrease the amount of time that NAND gate 55 spends in the metastable condition.

One may use the split-input and/or split-output inverting circuits (inverters, gates) described above to implement a variety of storage circuits. In exemplary embodiments, the storage circuits include latches and flip-flops.

Figures 10A, 10B:
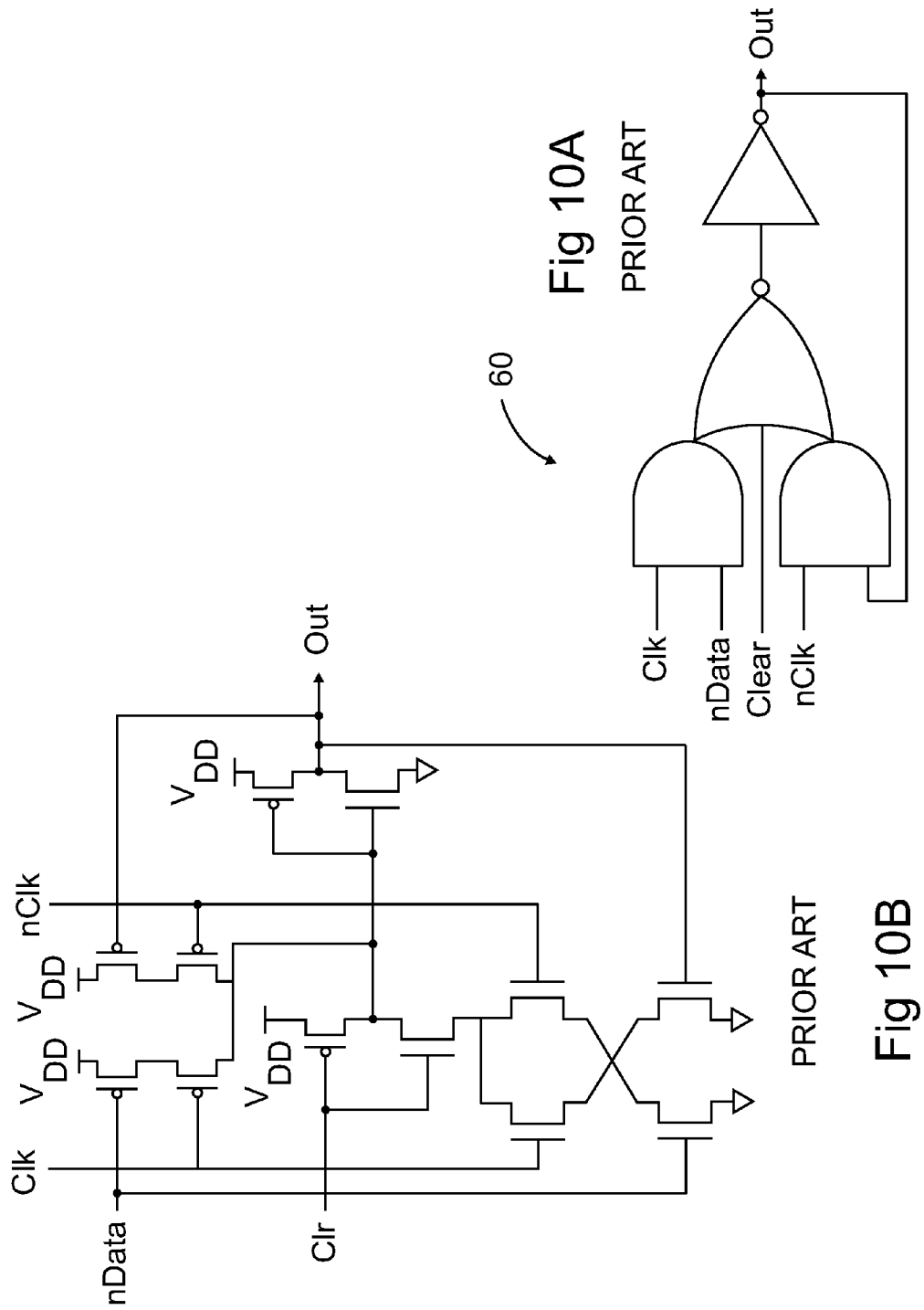
FIGS. 10A and 10B depict, respectively, a conventional latch, and its CMOS implementation.

FIGS. 10A and 10B depict, respectively, a conventional latch 60, and its CMOS implementation. The details of the circuitry and the operation of the latch in FIGS. 10A and 10B fall within the knowledge of persons of ordinary skill in the art. As persons of ordinary skill in the art understand, latch 60 includes unsplit (i.e., logical and physical signals connect to the same electrical node) physical inputs, and output(s).

Generally, as described above, storage circuits according to exemplary embodiments include two inverting circuits (e.g., gates, inverters). In some embodiments, the two inverting gates are cross-coupled so that the high-bias output of the first inverting circuit is physically coupled to the NMOS input of the second inverting circuit. Conversely, the low-bias output of the first inverting circuit is physically coupled to the PMOS input of the second inverting circuit.

In some embodiments, the logical output of the inverting circuit is logically coupled to the logical input of the second inverting circuit. The logical output of the first inverting circuit and/or the logical output of the second inverting circuit may also be split into two physical outputs (i.e., high-bias and low-bias outputs).

In some embodiments, one or more logical inputs of the first inverting circuit and/or one or more logical inputs of the second inverting circuit may also be split into two physical inputs (i.e., physical NMOS input and physical PMOS input, respectively). If so, the high-bias output of the first inverting circuit may be physically coupled to the NMOS input of the second inverting circuit. Conversely, the low-bias output of the first inverting circuit may be physically coupled to the PMOS input of the second inverting circuit.

In some embodiments, either of the inverting circuits element may have one or more additional inputs that can force the output of that element to either a logical 0 or a logical 1, or to a function of one or more of the other inputs, etc., as desired. These additional inputs can be used to clear or set (or preset) the cross-coupled latch, as persons of ordinary skill in the art who have the benefit of the description of the disclosed concepts understand.

In some embodiments, the logical output of the latch may be split. In this situation, the physical output of the latch may be coupled to either the high-bias or low-bias outputs of the first or second inverting circuit.

In metastability-hardened latches according to exemplary embodiments, when the latch is in a metastable state, both the PMOS and NMOS devices in the cross-coupled inverting path through the first inverting circuit are turned on strongly (due to the voltage bias difference between the split inputs feeding those devices). The high current and subsequently high gain through those devices causes the latch to settle out of its metastability state relatively quickly.

Figure 11A:
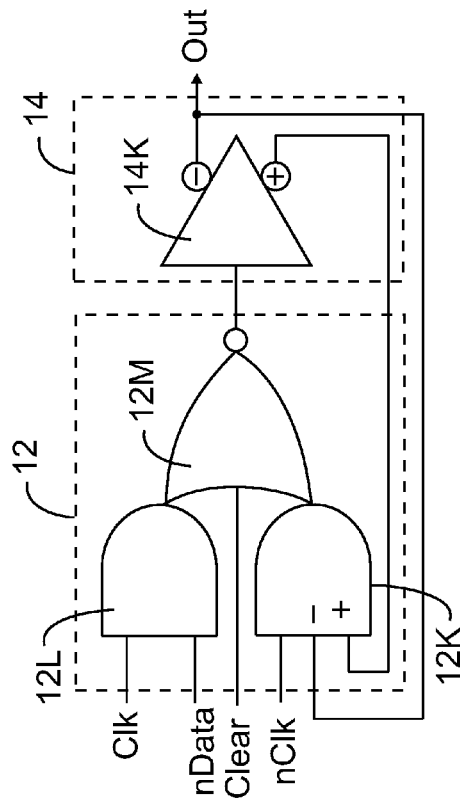
FIGS. 11A and 11B show, respectively, a latch and its CMOS implementation, according to an exemplary embodiment.
Figure 11B:
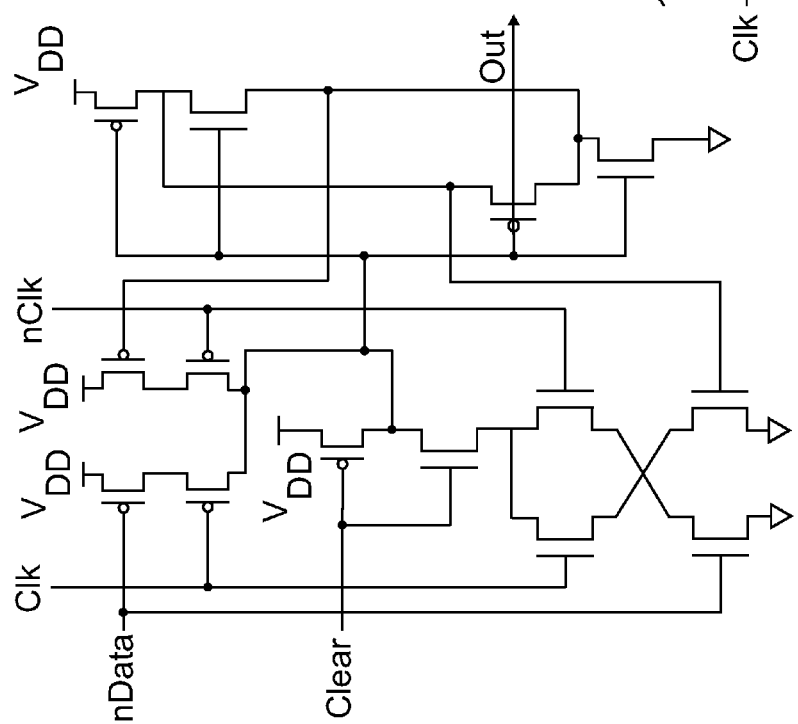

FIGS. 11A and 11B show, respectively, a metastability-hardened latch 65 and its CMOS implementation, according to an exemplary embodiment. Latch 65 includes inverting circuit 12 coupled to inverting circuit 14. Latch 65 has at least one split physical input and at least one split output along the feedback path of the latch.

Referring to FIG. 11A, inverting circuit 12 includes a complex AND-NOR gate, which includes AND gates 12K and 12L, and NOR gate 12M. One of the logical inputs of AND gate 12K has been physically split. The physically split inputs are labeled "+" and "−" and correspond to the NMOS and PMOS inputs, respectively.

AND gate 12K performs a logical AND operation of the complement of the clock signal and the output signal of latch 65 (i.e., the split output of inverter 14K, described below). AND gate 12L performs a logical AND operation of the clock signal and the complement of the Data signal. NOR gate 12M performs a logical NOR operation on the output signals of AND gates 12K and 12L and the Clear signal.

One input of inverting circuit 12, which is fed by the logical output of inverting circuit 14, is physically split into NMOS and PMOS inputs (denoted as the "−" and "+," inputs, respectively). The split input of inverting circuit 12 is coupled physically to the high-bias and low-bias outputs of inverting circuit 14 (described below), respectively.

Inverting circuit 14 includes inverter 14K. Inverter 14K has a split output, corresponding to high-bias and low-bias outputs (labeled, respectively, as the "+" and "−" outputs). Note that, in exemplary embodiments, one may implement the gates and/or inverters with split inputs and outputs, respectively, in a variety of ways.

FIG. 11B shows a CMOS implementation of latch 65, according to an exemplary embodiment. As persons of ordinary skill in the art who have the benefit of the description of the disclosed concepts understand, one may implement latch 65 in a variety of ways. FIG. 11B shows merely an exemplary implementation.

Note that, in the embodiment shown in FIG. 11B, the inverter in the feedback path (corresponding to inverter 14K in FIG. 11A) is physically implemented in the manner shown in FIGS. 4A and 4B. As persons of ordinary skill in the art who have the benefit of the description of the disclosed concepts understand, however, one may implement inverter 14K in a variety of other ways, as desired.

One may couple a pair of latches together to realize a flip-flop. Typically, a clock signal feeds one of the two latches, and the complement of the clock signal clocks the other latch.

Figure 12:
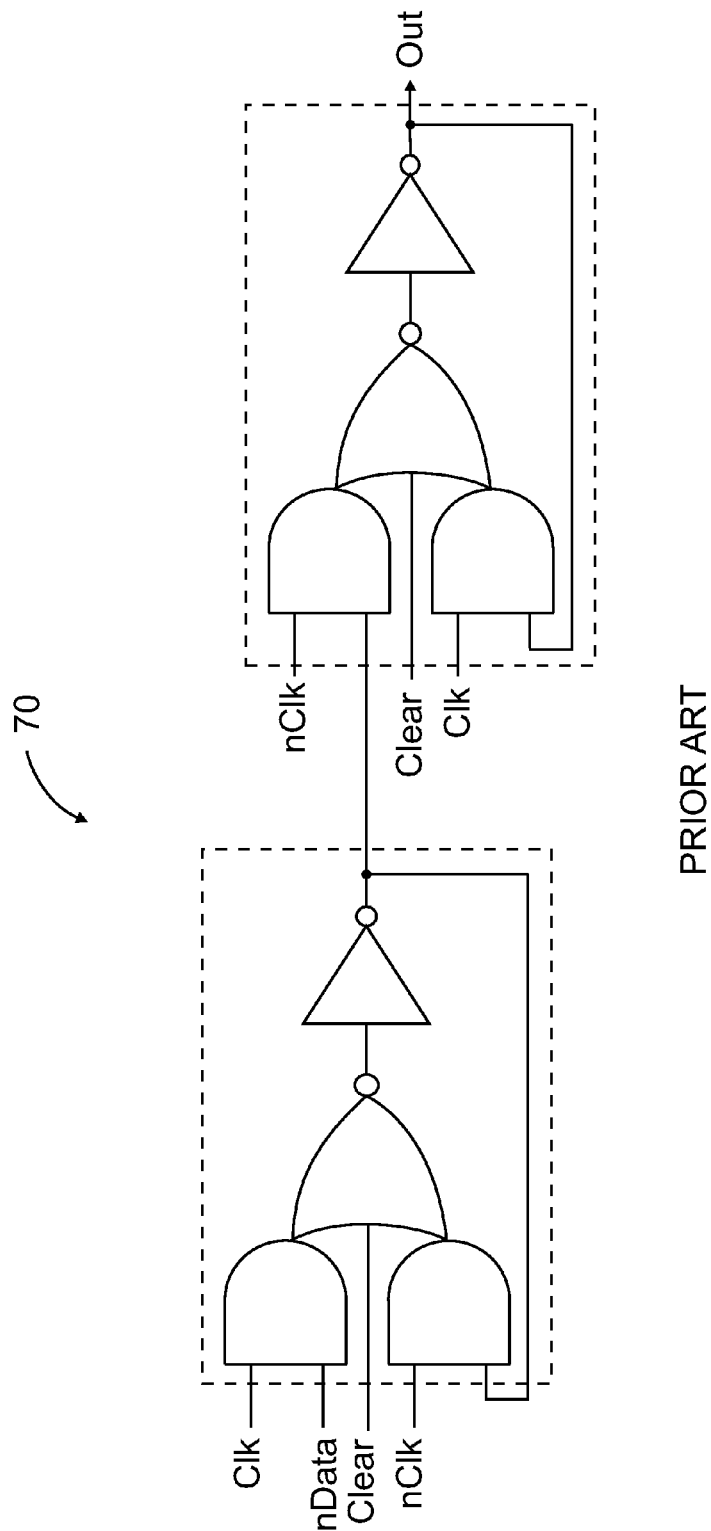
FIG. 12 illustrates a conventional flip-flop.

FIG. 12 illustrates a conventional flip-flop 70. The details of the circuitry and the operation of the flip-flop 70 fall within the knowledge of persons of ordinary skill in the art. As persons of ordinary skill in the art understand, flip-flop 70 includes unsplit (i.e., logical and physical signals connect to the same electrical node) physical inputs, and output(s).

Figure 13:
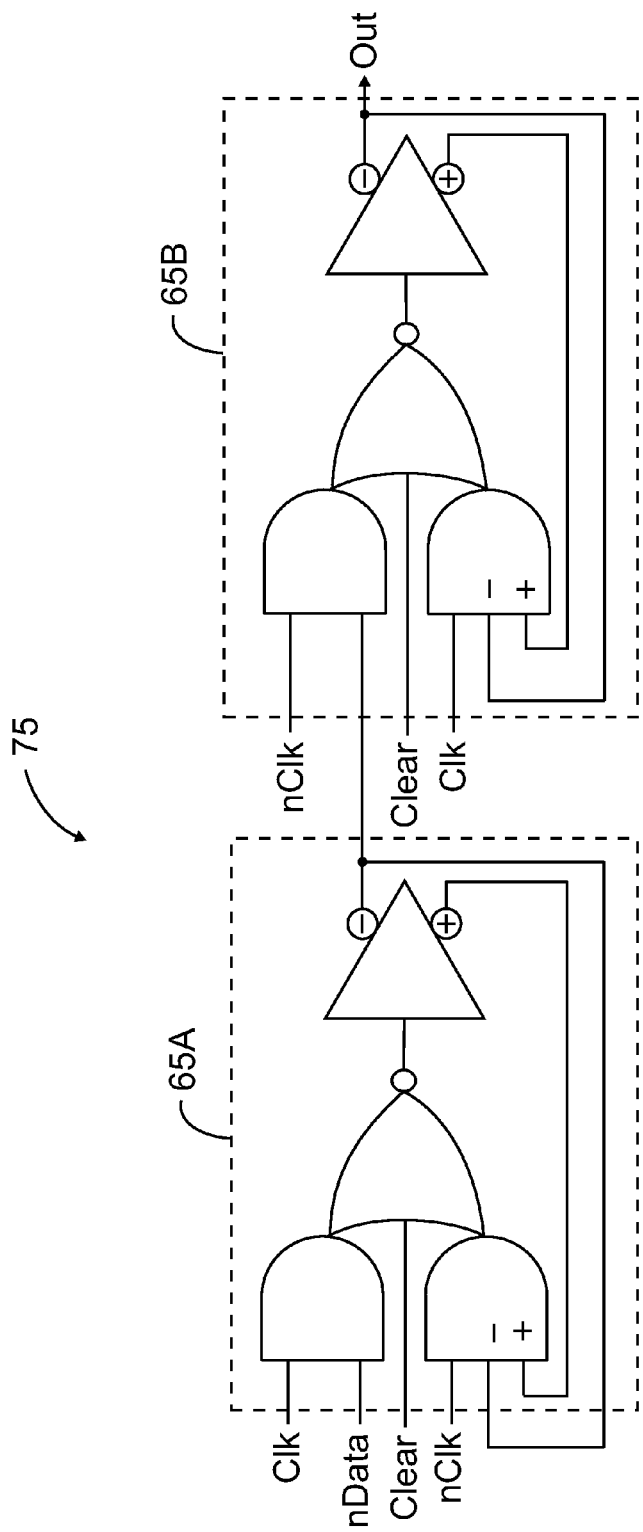
FIG. 13 depicts a flip-flop according to an exemplary embodiment.

FIG. 13 depicts a flip-flop 75 according to an exemplary embodiment. Flip-flop 75 include a cascade coupling of metastability-hardened latches 65A and 65B.

Each of latches 65A and 65B may have the structure and functionality of latch 65, shown in FIGS. 11A-11B, and described above. Thus, flip-flop 75 includes latches that have at least one split input and at least one split output. In other embodiments, one latch might have a split input, while the other latch has a split output, as desired.

Figure 14:
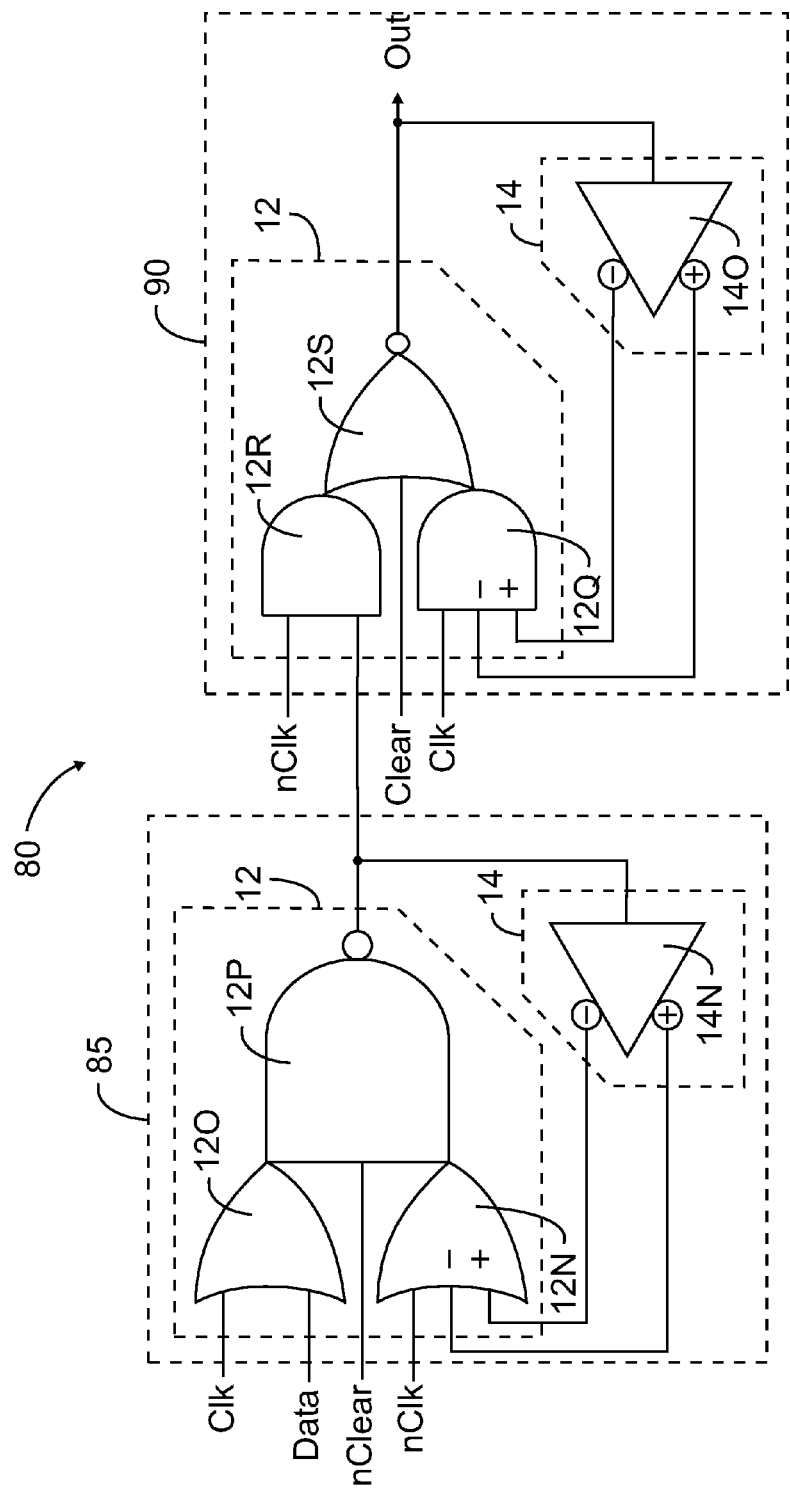
FIG. 14 shows a flip-flop according to another exemplary embodiment.

FIG. 14 shows a flip-flop 80 according to another exemplary embodiment. Flip-flop 80 include a cascade coupling of metastability-hardened latches 85 and 90.

Conceptually, flip-flop 80 includes an active-low metastability hardened latch 85, coupled to an active-high metastability hardened latch 90. Active-low latch 85 is implemented in an analogous manner to active-high latch 90. Active-low latch 85, however, uses an OR-NAND structure, rather than the AND-NOR structure of active-high latch 90.

Latch 85 includes inverting circuit 12 coupled to inverting circuit 14. Latch 85 has at least one split physical input and at least one split output along the feedback path of the latch.

Referring to latch 85, inverting circuit 12 includes a complex OR-NAND gate, which includes OR gates 12N and 12O, and NAND gate 12P. One of the logical inputs of OR gate 12N has been physically split. The physically split inputs are labeled "+" and "−" and correspond to the NMOS and PMOS inputs, respectively.

OR gate 12N performs a logical OR operation of the complement of the clock signal and the complement of the output signal of latch 85 (i.e., the split output of inverter 14N, described below). OR gate 12O performs a logical OR operation of the clock signal and the Data signal. NAND gate 12P performs a logical NAND operation on the output signals of OR gates 12N and 12O, and the complement of the Clear signal.

One input of inverting circuit 12, which is fed by the logical output of inverting circuit 14, is physically split into NMOS and PMOS inputs (denoted as the "" and "+," inputs, respectively). The split input of inverting circuit 12 is coupled physically to the high-bias and low-bias outputs of inverting circuit 14 (described below), respectively.

Inverting circuit 14 includes inverter 14N. Inverter 14N has a split output, corresponding to high-bias and low-bias outputs (labeled, respectively, as the "+" and "−" outputs). Note that, in exemplary embodiments, one may implement the gates and/or inverters with split inputs and outputs, respectively, in a variety of ways.

Latch 90 includes inverting circuit 12 coupled to inverting circuit 14. Latch 90 has at least one split physical input and at least one split output along the feedback path of the latch.

Referring to latch 90, inverting circuit 12 includes a complex AND-NOR gate, which includes AND gates 12Q and 12R, and NOR gate 12S. One of the logical inputs of AND gate 12Q has been physically split. The physically split inputs are labeled "+" and "−" and correspond to the NMOS and PMOS inputs, respectively.

AND gate 12Q performs a logical AND operation of the clock signal and the complement of the output signal of latch 90 (i.e., the split output of inverter 140, described below). AND gate 12R performs a logical AND operation of the complement of the clock signal and the output signal of latch 85. NOR gate 12S performs a logical NOR operation on the output signals of AND gates 12Q and 12R, and the Clear signal.

One input of inverting circuit 12, which is fed by the logical output of inverting circuit 14, is physically split into NMOS and PMOS inputs (denoted as the "" and "+," inputs, respectively). The split input of inverting circuit 12 is coupled physically to the high-bias and low-bias outputs of inverting circuit 14 (described below), respectively.

Inverting circuit 14 includes inverter 140. Inverter 140 has a split output, corresponding to high-bias and low-bias outputs (labeled, respectively, as the "+" and "−" outputs). Note that, in exemplary embodiments, one may implement the gates and/or inverters with split inputs and outputs, respectively, in a variety of ways.

Figure 15:
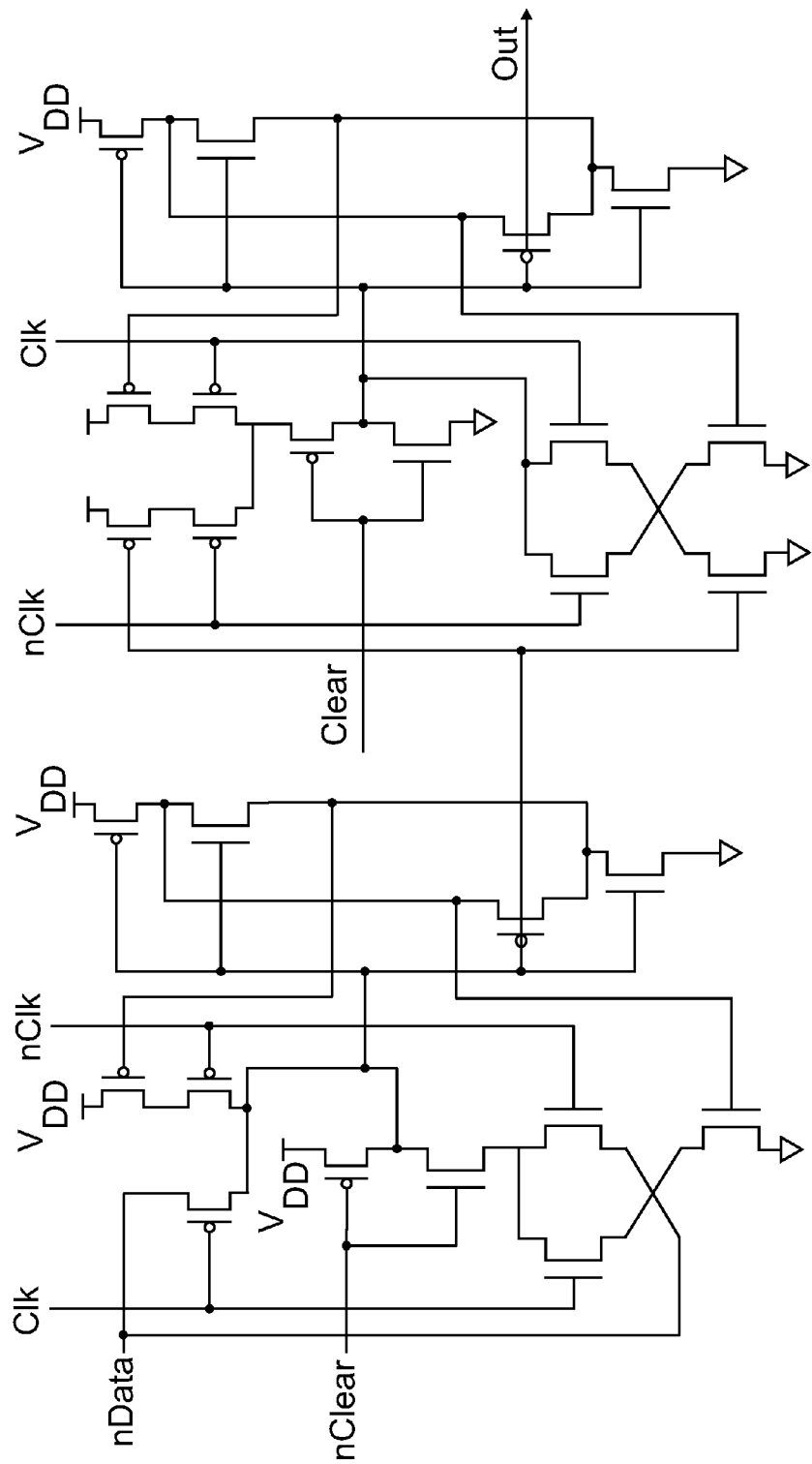
FIG. 15 illustrates an exemplary CMOS implementation of the flip-flop of FIG. 14, according to an exemplary embodiment.

FIG. 15 illustrates an exemplary CMOS implementation of flip-flop 80 (see FIG. 14), according to an exemplary embodiment. As persons of ordinary skill in the art who have the benefit of the description of the disclosed concepts understand, one may implement flip-flop 80 in a variety of ways. FIG. 15 shows merely an exemplary implementation.

Figure 16:
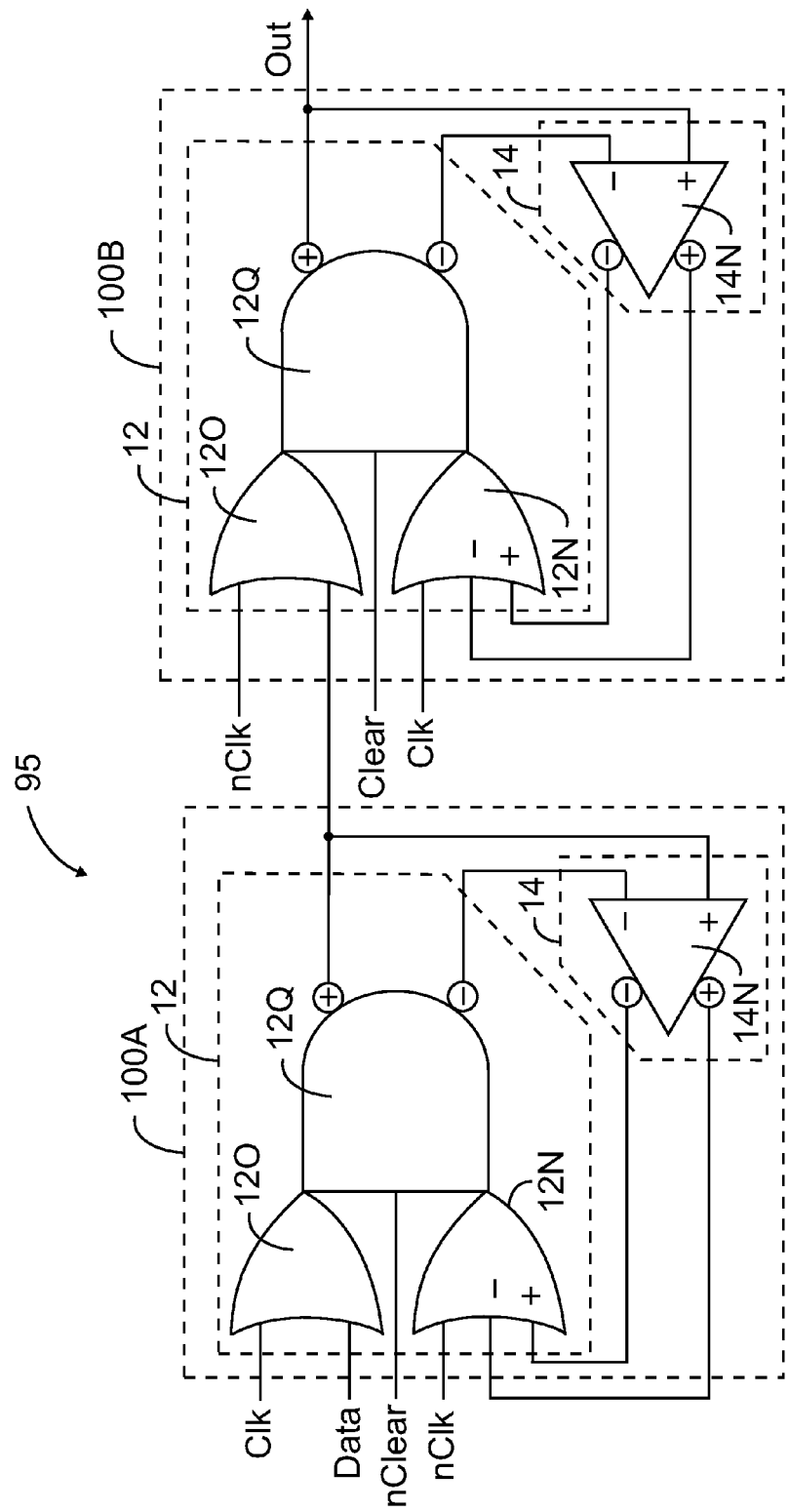
FIG. 16 depicts a flip-flop according to another exemplary embodiment.

FIG. 16 depicts a flip-flop 95 according to another exemplary embodiment. Flip-flop 95 includes latch 100A coupled to latch 100B.

In the embodiment shown, latches 100A and 100B have a similar structure, and operates similarly. The following description of latch 100A also pertains to latch 100B.

Latch 100A includes inverting circuit 12, coupled in a cascade fashion to inverting circuit 14. Both of inverting circuit 12 and inverting circuit 14 have a split input, and a split output.

Latch 100A includes inverting circuit 12 coupled to inverting circuit 14. Latch 100A has at least two split physical inputs and at least two split outputs along the feedback path of the latch.

Referring to latch 100A, inverting circuit 12 includes a complex OR-NAND gate, which includes OR gates 12N and 12O, and NAND gate 12Q. One of the logical inputs of OR gate 12N has been physically split. The physically split inputs are labeled "+" and "−" and correspond to the NMOS and PMOS inputs, respectively.

OR gate 12N performs a logical OR operation of the complement of the clock signal and the complement of the output signal of latch 100A (i.e., the split output of inverter 14N, described below). OR gate 12O performs a logical OR operation of the clock signal and the Data signal.

One input of inverting circuit 12, which is fed by the logical output of inverting circuit 14, is physically split into NMOS and PMOS inputs (denoted as the "" and "+," inputs, respectively). The split input of inverting circuit 12 is coupled physically to the high-bias and low-bias outputs of inverting circuit 14 (described below), respectively.

NAND gate 12Q performs a logical NAND operation on the output signals of OR gates 12N and 12O, and the complement of the Clear signal. NAND gate 12Q has a logical output, which is split into high-bias and low-bias outputs (labeled, respectively, as the "+" and "−" outputs).

Inverting circuit 14 includes inverter 14N. Inverter 14N has a split output, corresponding to high-bias and low-bias outputs (labeled, respectively, as the "+" and "−" outputs). Note that, in exemplary embodiments, one may implement the gates and/or inverters with split inputs and outputs, respectively, in a variety of ways.

As persons of ordinary skill in the art who have the benefit of the description of the disclosed concepts understand, one may use storage circuits according to the disclosed concepts in various electronic circuits or devices. Examples include integrated circuits (ICs), application specific ICs (ASICs), general-purpose or special-purpose ICs, field programmable gate arrays (FPGAs) programmable logic devices (PLDs), and the like.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of this disclosure understand. Other modifications and alternative embodiments in addition to those described here will be apparent to persons of ordinary skill in the art who have the benefit of this disclosure. Accordingly, this description teaches those skilled in the art the manner of carrying out the disclosed concepts and are to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. A method of using a metastability-hardened storage circuit, the method comprising:
    applying a signal to an input of the storage circuit, the storage circuit comprising a first inverting circuit having a logical input that is split into a pair of physical inputs.

2. The method according to claim 1, wherein the metastability-hardened storage circuit comprises a latch.

3. The method according to claim 1, wherein the first inverting circuit comprises a gate having at least a pair of inputs.

4. The method according to claim 1, wherein the first inverting circuit comprises an inverter.

5. The method according to claim 1, wherein the first inverting circuit further comprises a logical output that is split into a pair of physical outputs.

6. The method according to claim 1, further comprising using a second inverting circuit coupled to the first inverting circuit, the second inverting circuit having a logical input that is split into a pair of physical inputs.

7. The method according to claim 6, wherein the second inverting circuit comprises an inverter.

8. The method according to claim 6, wherein the second inverting circuit further comprises a logical output that is split into a pair of physical outputs.

9. The method according to claim 1, further comprising using a second inverting circuit coupled to the first inverting circuit, the second inverting circuit having a logical output that is split into a pair of physical outputs.

10. The method according to claim 9, wherein the second inverting circuit further comprises a logical input that is split into a pair of physical inputs.

11. A method of using a metastability-hardened storage circuit, the method comprising:
    applying a signal to an input of the storage circuit, the storage circuit comprising a first inverting circuit having a logical output that is split into a pair of physical outputs.

12. The method according to claim 11, wherein the first storage circuit further comprises a logical input that is split into a pair of physical inputs.

13. The method according to claim 11, further comprising using a second inverting circuit coupled to the first inverting circuit, the second inverting circuit having a logical input that is split into a pair of physical inputs.

14. The method according to claim 13, wherein the second inverting circuit further comprises a logical output that is split into a pair of physical outputs.

15. The method according to claim 13, wherein using a second inverting circuit further comprises using a latch.

16. The method according to claim 11, further comprising using a second inverting circuit coupled to the first inverting circuit, the second inverting circuit having a logical output that is split into a pair of physical outputs.

17. The method according to claim 16, wherein the second inverting circuit further comprises a logical input that is split into a pair of physical inputs.

18. A method of operating an integrated circuit (IC) having a first circuit having a first logical input and a first logical output split into a first high-bias physical output and a first low-bias physical output, the method comprising:
    during a metastable state of the first circuit, providing an output voltage of the first high-bias physical output that is higher than an output voltage of the first low-bias physical output.

19. The method according to claim 18, further comprising providing an inverting function of the first logical input as the first logical output.

20. The method according to claim 19, further comprising providing an inverting function of the second logical input as the second logical output.

* * * * *